(12) United States Patent
Barkan et al.

(10) Patent No.: US 12,146,782 B2
(45) Date of Patent: *Nov. 19, 2024

(54) WEIGH PLATTER ASSEMBLY WITH PARALLAX BASED OFF-PLATTER DETECTION (71) Applicant: ZEBRA TECHNOLOGIES CORPORATION, Lincolnshire, IL (US)

(72) Inventors: Edward Barkan, Miller Place, NY (US); Darran Michael Handshaw, Sound Beach, NY (US); Mark Drzymala, Saint James, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/233,494

(22) Filed: Aug. 14, 2023

(65) Prior Publication Data
US 2023/0384145 A1 Nov. 30, 2023

Related U.S. Application Data (63) Continuation of application No. 17/740,167, filed on May 9, 2022, now Pat. No. 11,725,978, which is a continuation of application No. 16/724,052, filed on Dec. 20, 2019, now Pat. No. 11,326,933.

(51) Int. Cl.
H01L 27/14 (2006.01)
G01G 19/414 (2006.01)
G01G 23/01 (2006.01)
H01L 27/146 (2006.01)

(52) U.S. Cl.
CPC ......... G01G 19/4144 (2013.01); G01G 23/01 (2013.01); H01L 27/14605 (2013.01)

(58) Field of Classification Search
CPC ............... G01G 19/4144; G01G 23/01; H01L 27/14605
See application file for complete search history.

(56) References Cited

U.S. PATENT DOCUMENTS 9,347,819 B2 * 5/2016 Atwater ............ G01G 23/3735

* cited by examiner

Primary Examiner — Randy W Gibson
(74) Attorney, Agent, or Firm — Yuri Astvatsaturov (57) ABSTRACT A weigh platter assembly includes a weigh platter and an off-platter detection assembly having a light emission assembly, a light detection assembly, and a controller. The light emission assembly has a light source to emit a light along a lateral edge of the weigh platter. The light detection assembly detects at least a portion of the light reflected from an object extending across the light beam and includes a sensor offset from the light source and an aperture positioned in front of the sensor and configured to limit a field of view of the sensor along the lateral edge. The controller is configured to provide a first signal in response to a first value received from the sensor and to provide a second signal, different from the first signal, in response to a second value.

20 Claims, 7 Drawing Sheets

FIG. 7

WEIGH PLATTER ASSEMBLY WITH PARALLAX BASED OFF-PLATTER DETECTION

CROSS-REFERENCE TO RELATED APPLICATION(S)

This application is a continuation of U.S. patent application Ser. No. 17/740,167, filed on May 9, 2022, which is a continuation of U.S. patent application Ser. No. 16/724,052, filed on Dec. 20, 2019, both of which are incorporated herein by reference in their entirety.

FIELD OF THE DISCLOSURE

The present patent relates generally to weigh platters assemblies and, in particular, to weigh platter assemblies having off-platter detection for use in barcode readers.

BACKGROUND

One of the main functions of a weigh platter, whether used alone or in conjunction with a barcode scanner at a point-of-sale (POS), is to weigh produce or other products that are priced by weight in order to assist in determining the price of the produce or product. However, produce and products are varied in shape and size and there can be issues where part of the produce or product sits off of the weigh platter, resulting in incorrect weight measurement and, therefore, incorrect pricing. Therefore, there is a need to be able to identify when produce or products being weighed on a weigh platter extend off of the weigh platter during the weighing process to reduce or eliminate instances of incorrect weight measurement and pricing.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed examples, and explain various principles and advantages of those embodiments.

The apparatus and method components have been represented where appropriate by conventional symbols in the drawings, showing only those specific details that are pertinent to understanding the disclosed examples so as not to obscure the disclosure with details that will be readily apparent to those of ordinary skill in the art having the benefit of the description herein.

DETAILED DESCRIPTION

The examples disclosed herein relate to weigh platter assemblies, which could be used with barcode readers, such as bioptic barcode readers, having off-platter detection assemblies to identify when an object extends off of the weigh platter of the weigh platter assembly. In the examples disclosed, the off-platter detection assemblies have offset light sources and sensors with different lines of sight along a lateral edge of the weigh platter to determine if the item is extending across the lateral edge and off the weigh platter and where along the lateral edge the item is crossing the lateral edge. The example off-platter detection assemblies also limit the field-of-view (FOV) of the sensors to the length of the lateral edge of the weigh platter so that objects that are located beyond the edges of the weigh platter are not detected.

Figure 1:
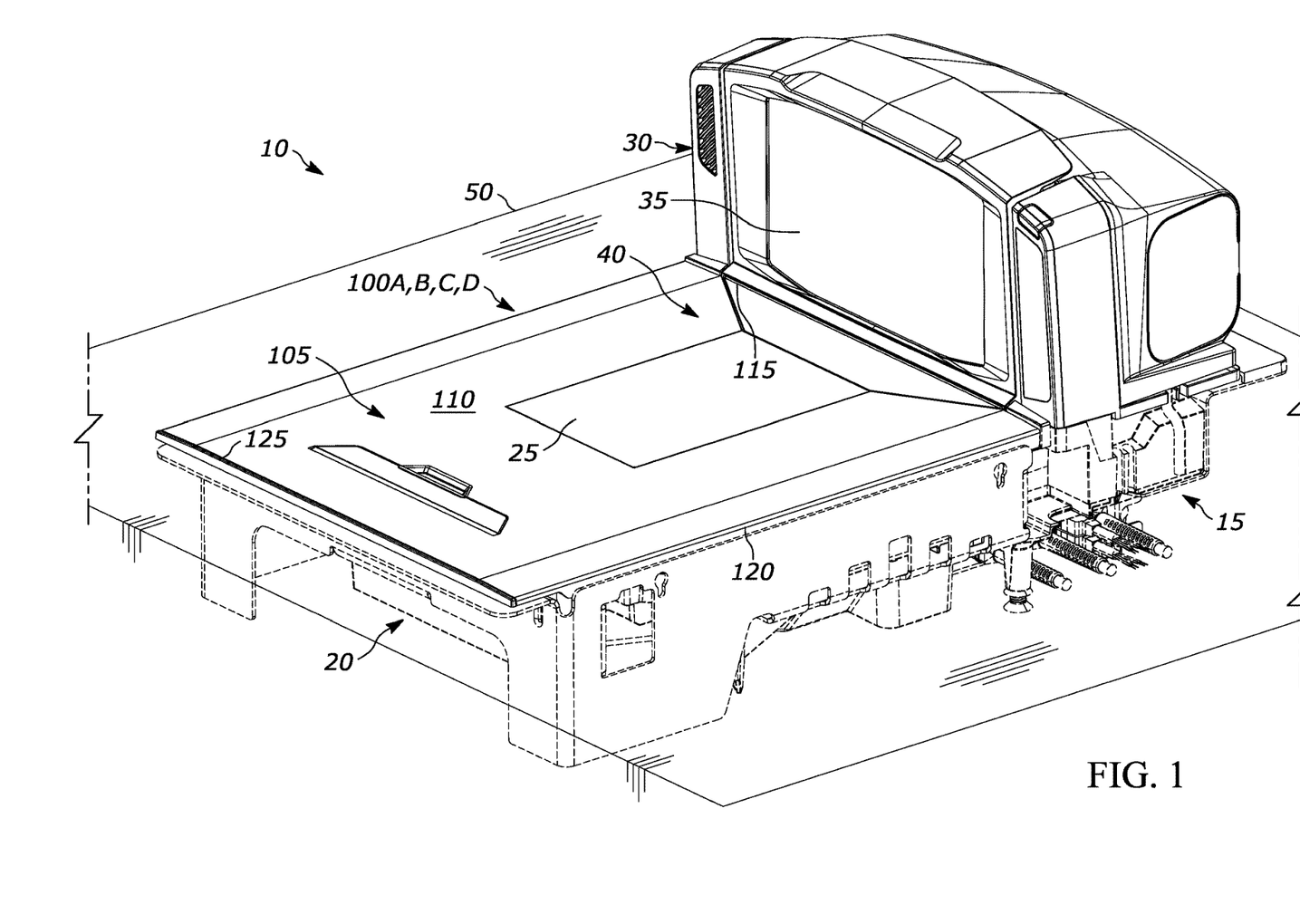
FIG. 1 illustrates a front perspective view of an example bioptic barcode reader having a weigh platter assembly.

Referring to FIG. 1, an example barcode reader 10, such as the Zebra® M P7000 bioptic barcode reader, is shown and can be configured to be supported by a workstation 50, such as a checkout counter at a POS of a retail store. Barcode reader 10 has a housing 15 that includes a lower housing 20 that houses a weigh platter assembly 100A, 100B, 100C, 100D and an upper housing 30 that extends generally perpendicular to lower housing 20. Upper housing 30 includes a generally vertical window 35 to allow a first set of optical components positioned within upper housing 30 to direct a first FOV through vertical window 35. In addition, if barcode reader 10 is a bioptic barcode scanner, lower housing 20 will include a generally horizontal window 25, which in the example shown is positioned in a weigh platter 105 of weigh platter assembly 100A, 100B, 100C, 100D to allow a second set of optical components positioned within lower housing 20 to direct a second field of view through horizontal window 25. The first and second fields of view intersect to define a product scanning region 40 of barcode reader 10 where a product can be scanned for sale at the POS.

Although weigh platter assembly 100A, 100B, 100C, 100D is described above and shown in FIG. 1 as being used with a barcode reader or bioptic barcode reader, weigh platter assembly 100A, 100B, 100C, 100D can be used with any type of scanner or POS device or can be used as a stand-alone scale or weighing device. Whether used as part of a barcode reader, scanner or POS device, or as a stand-alone scale or weighing device, weigh platter assembly 100A, 100B, 100C, 100D will generally include a weigh platter 105 that is configured to measure the weight of an object placed on weigh platter 105. Weigh platter 105 has top surface 110 that is generally parallel to a top surface of workstation 50, a proximal edge 115, lateral edge 120, and distal edge 125. In the example shown, proximal edge 115 is adjacent upper housing 30 and would be the edge furthest from a user of weigh platter assembly 100A, 100B, 100C, 100D and/or barcode reader 10. Lateral edge 120 extends non-parallel to proximal edge 115 and distal edge 125 is opposite proximal edge 115, would be the edge closest to the user, and extends non-parallel to lateral edge 120. In the example shown, weigh platter is generally rectangular and lateral edge 120 is perpendicular to proximal edge 115 and distal edge 125 is perpendicular to lateral edge 120 and parallel to proximal edge 115.

Figure 2:
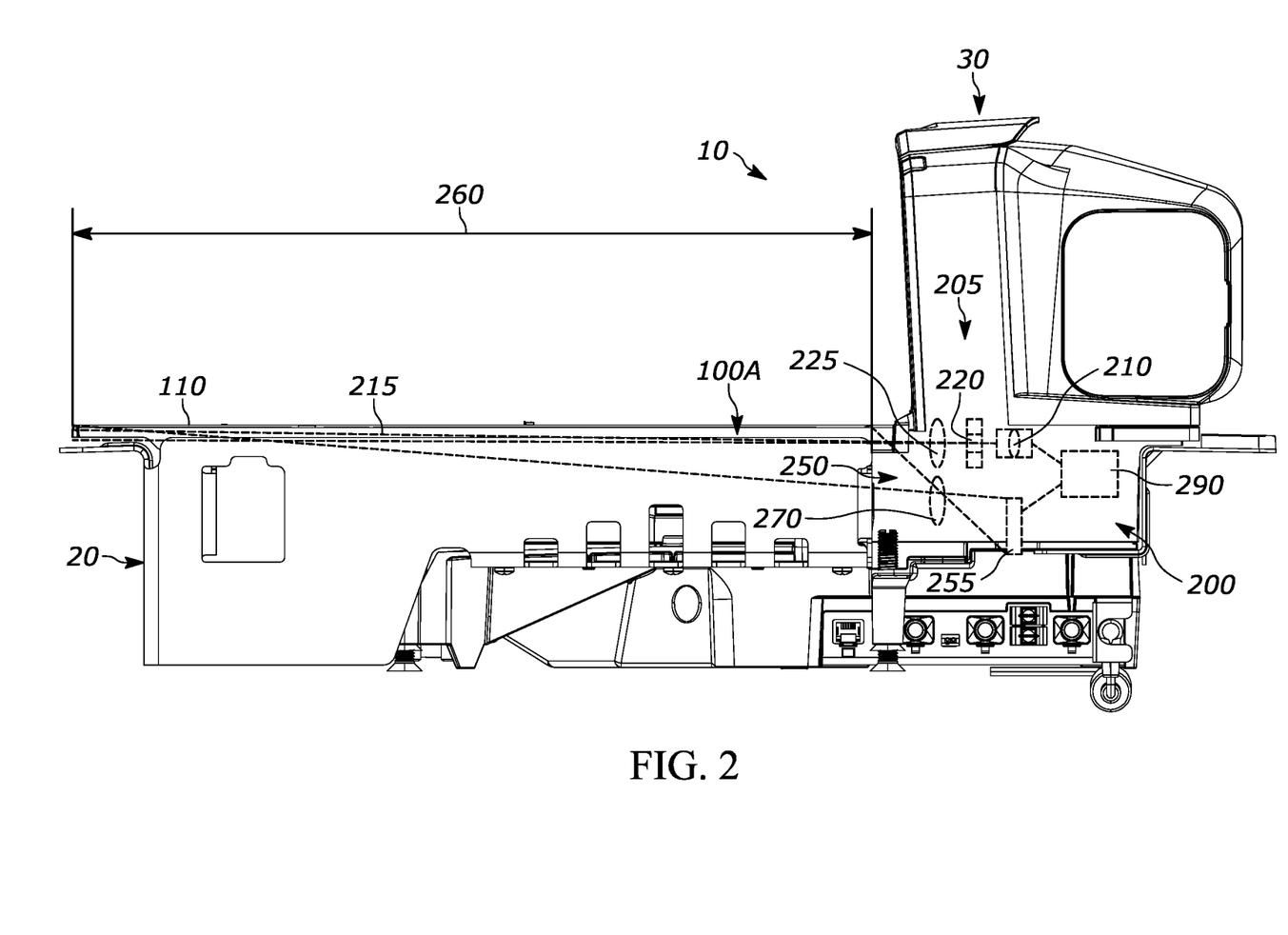
FIG. 2 illustrates a side view of the bioptic barcode reader of FIG. 1 with the weigh platter assembly having a first example parallax based off-platter detection assembly.
Figure 3:
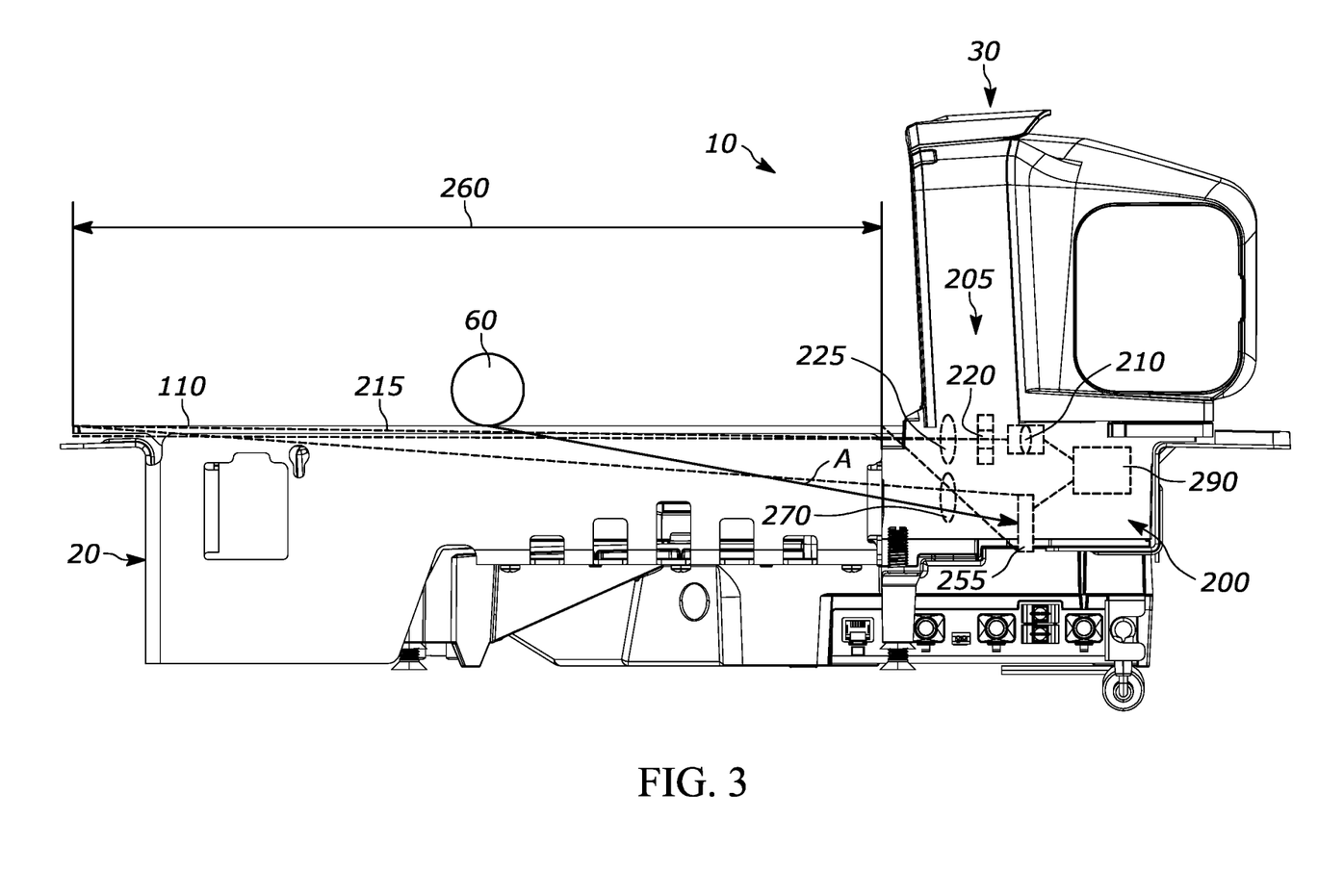
FIG. 3 illustrates the bioptic barcode reader of FIG. 2 with an object extending across a lateral edge of the weigh platter assembly.

Referring to FIGS. 2-3, barcode reader 10 is illustrated with an example weigh platter assembly 100A, which includes a weigh platter 105 and a parallax based off-platter detection assembly 200. The example off-platter detection assembly 200 generally includes a light emission assembly 205, light detection assembly 250, and controller 290 in communication with light emission assembly 205 and light detection assembly 250. For simplicity, only a single light emission assembly 205 and light detection assembly 250 along lateral edge 120 are described herein, however, it will be understood that off-platter detection assembly 200 can also include a second light emission assembly and a second light detection assembly on an opposite side of weigh platter assembly 100A to detect objects that extend over an opposing lateral edge, opposite lateral edge 120.

Light emission assembly 205 has a light source 210 and is configured to emit a light beam 215 along lateral edge 120 of weigh platter 105. Light source 210 could be an LED that is focused into a narrow beam, similar to an aiming dot used in scanners, a focused laser beam, etc. and light beam 215 would preferably be on the infrared wavelength, but could also be visible light. Light emission assembly 205 can also include an aperture 220, which could be formed in a wall or protrusion of housing 15 or could be formed through another wall or structure that is part of weigh platter assembly 100A, positioned in front of light source 210 to focus light beam 215 into a narrow beam along lateral edge 120 of weigh platter 105. In addition, a lens 225 can be positioned in front of aperture 220 to increase the intensity of light beam 215.

Light detection assembly 250 is configured to detect at least a portion of light beam 215 that is reflected from an object that extends across light beam 215, and therefore off weigh platter 105, with a position sensitive sensor 255, which could be a two-dimensional sensor array, proportional current-based position sensitive detector, linear imager array of pixels, etc. In the example shown, position sensitive sensor 255 is vertically offset from light source 210 such that each has a different line of site along lateral edge 120 and to an object. Light source 210 is positioned above or aligned with weigh platter 105 and position sensitive sensor 255 is positioned below weigh platter 105 and horizontally aligned with light source 210 to detect the portion of light beam 215 reflected from an object along lateral edge 120. Position sensitive sensor 255 has a FOV 260 along lateral edge 120 of weigh platter 105 that is limited to the length of lateral edge 120 between proximal edge 115 and distal edge 125. As shown in FIGS. 203, FOV 260 of position sensitive sensor 255 is limited by sizing and positioning position sensitive sensor 255 such that a portion of light beam 215 that is reflected from an object that is beyond proximal edge 115 or distal edge 125 is outside of a detection area of position sensitive sensor 255 and, therefore, is not detected. Alternatively, rather than limiting FOV 260 by the physical size and position of position sensitive sensor 255, controller 290 can be configured to recognize that reflected light detected at certain portions of position sensitive sensor 255 indicate that an object is between proximal edge 115 and distal edge 125 and that reflected light detected at other portions, such as outer portions, of position sensitive sensor 255 indicate that an object is beyond proximal edge 155 or distal edge 125 and can be ignored. Finally, an aperture (see, e.g., aperture 365 in FIG. 6), which could be formed in a wall or protrusion of housing 15 or could be formed through another wall or structure that is part of weigh platter assembly 100A, can also be positioned in front of position sensitive sensor 255 and be configured with a specific shape and size to limit and control FOV 260 along lateral edge 120 to the length of lateral edge 120 between proximal edge 115 and distal edge 125. With the limited FOV 260 created by the aperture, any portion of light beam 215 that is reflected from an object that is beyond distal edge 125 will not pass through the aperture and will not be detected by position sensitive sensor 255. In addition, a lens 270 can be positioned in front of position sensitive sensor 255, or in front of the aperture if used, to increase the intensity of the portion of light reflected from an object extending across light beam 215 toward position sensitive sensor 255.

To increase the accuracy of off-platter detection assembly 200, particularly in bright environments with multiple light sources, light emission assembly 205 can be configured to modulate light beam 215 at a predetermined frequency and position sensitive sensor 255 can be configured to detect light at the predetermined frequency so that off-platter detection assembly 200 is insensitive to other light sources.

Controller 290 is in communication with position sensitive sensor 255 of light detection assembly 250, and a position sensitive sensor of the second light detection assembly if used, and is configured to determine if an object extends across lateral edge 120 and off of weigh platter 105 based on the position of the portion of light beam 215 reflected from the object on position sensitive sensor 255. Controller 290 receives signals from position sensitive sensor 255 and based on the signals received from position sensitive sensor 255, controller 290 is configured to provide a first signal to a host system in response to a first value received from position sensitive sensor 255 (e.g., a value indicating that no reflected light is being detected in a position on position sensitive sensor 255 corresponding to the limited FOV 260) and to provide a second signal, different from the first signal, in response to a second value received from position sensitive sensor 255 (e.g., a value indicating that reflected light has been detected in a position on position sensitive sensor 255 corresponding to the limited FOV 260). In addition, since position sensitive sensor 255 is being used, controller 290 can also be configured to determine the position of object 60 along lateral edge 120 of weigh platter 105 based on the position of the portion of light beam 215 reflected from object 60 on position sensitive sensor 255 and to provide a third signal, different from the first and second signals, indicating the position of object 60 along later edge 120.

Figure 4:
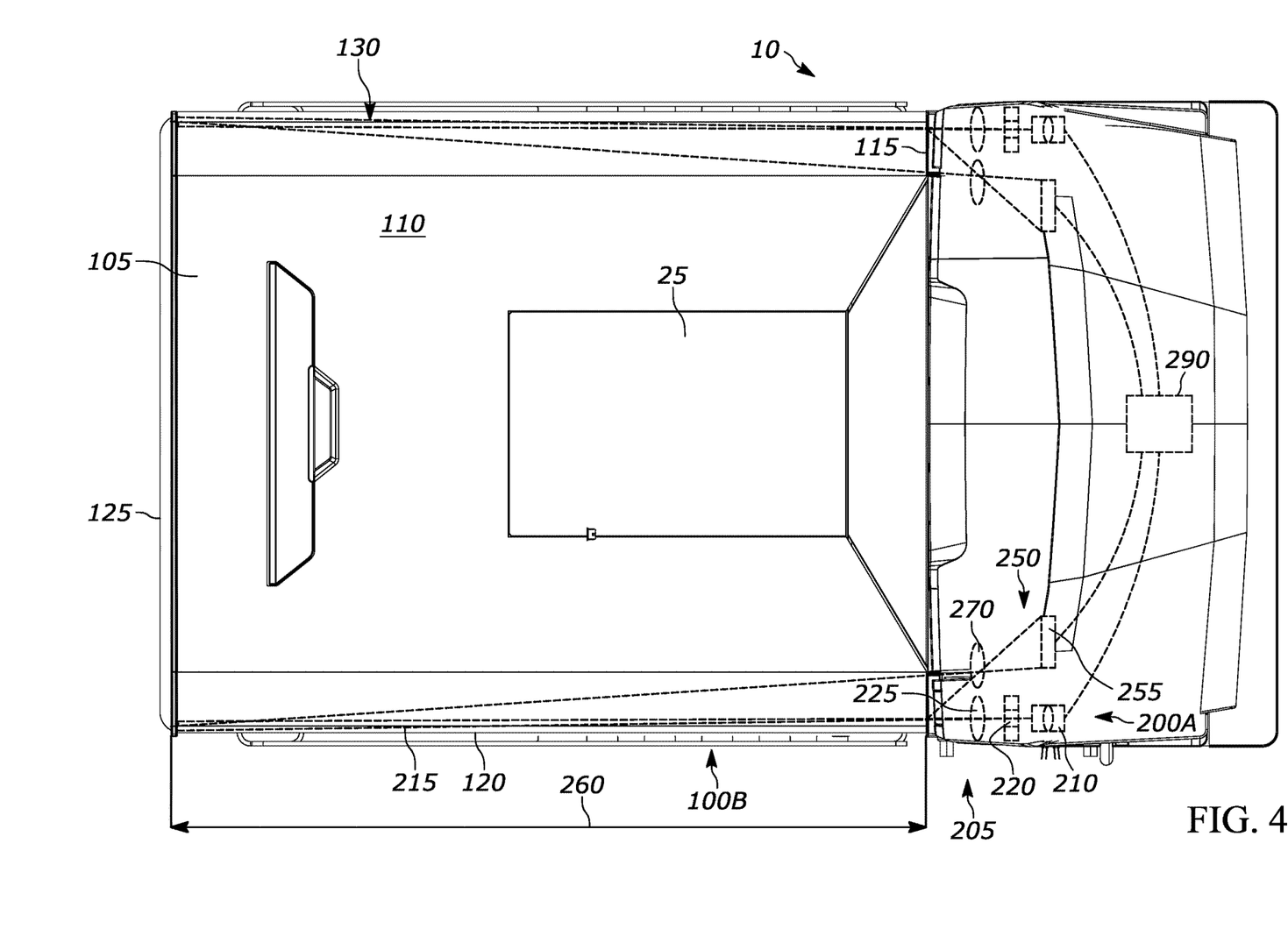
FIG. 4 illustrates a top view of the bioptic barcode reader of FIG. 1 with the weigh platter assembly having a second example parallax based off-platter detection assembly.
Figure 5:
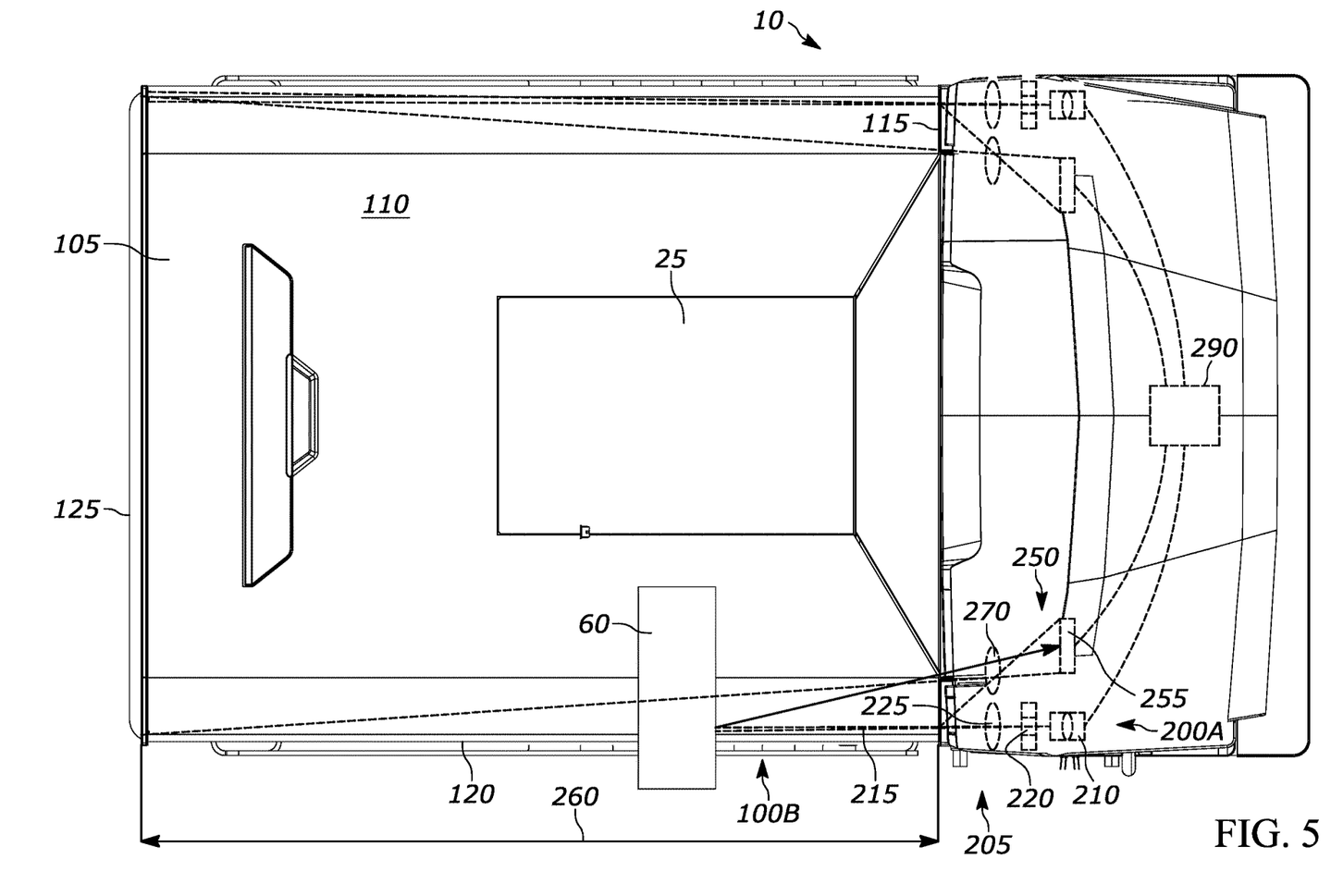
FIG. 5 illustrates the bioptic barcode reader of FIG. 4 with an object extending across a lateral edge of the weigh platter assembly.

In FIGS. 4-5, another barcode reader 10 is illustrated with another example weigh platter assembly 100B, which is essentially the same as weigh platter assembly 100A described above, except for the offset positioning of light source 210 and position sensitive sensor 255. In the example shown in FIGS. 4-5, position sensitive sensor 255 is horizontally offset from light source 210 such that each has a different line of site along lateral edge 120 and to the object. Light source 210 is positioned above or aligned with weigh platter 105 and position sensitive sensor 255 is positioned above weigh platter 105 and preferably vertically aligned with light source 210 to detect the portion of light beam 215 reflected from object 60 along lateral edge 120.

As shown in FIGS. 3 and 5, in operation, light emission assembly 205 of off-platter detection assembly 200 or off-platter detection assembly 200A emits light beam 215 from light source 210 along lateral edge 120 of weigh platter 105. As discussed above, an aperture 220 can be placed in front of light source 210 to focus light beam 215 into a narrow beam along lateral edge 120 and a lens 225 can be place in front of aperture 220 to increase the intensity of light beam 215. In addition, to increase the accuracy, light emission assembly 205 can modulate light beam 215 at a predetermined frequency that can be detected by position sensitive sensor 255.

Position sensitive sensor 255, which is vertically offset (FIG. 3) or horizontally offset (FIG. 5) from light source 210, has FOV 260 that is limited to the length of weigh platter 105 from proximal edge 115 to distal edge 125. When an object 60 extends across light beam 215, and therefore off weigh platter 105, a portion of light beam 215 is reflected from object 60 and towards position sensitive sensor 255 (represented by arrow A) and position sensitive sensor 255 detects the portion of light beam 215 reflected from object 60. If light source 210 is positioned above weigh platter and position sensitive sensor 255 is positioned below weigh platter 105 and horizontally aligned with light source 210 (FIG. 3), the portion of light beam 215 reflected from object 60 can be detected within a gap 130 (see FIG. 4) formed adjacent lateral edge 120. As discussed above, an aperture 265 can also be positioned in front of position sensitive sensor 255 and configured to limit FOV 260 of position sensitive sensor 255. In addition, to increase the accuracy, position sensitive sensor 255 can be configured to detect light at the predetermined frequency of light beam 215 so that off-platter detection assembly 200/200A is insensitive to other light sources.

Controller 290 receives a signal from position sensitive sensor 255 indicating that reflected light from object 60 has been detected and the position of the detected on position sensitive sensor 255. Depending on the position of the portion of light beam 215 reflected from object 60 on position sensitive sensor 255, controller 290 then determines if object 60 extends across lateral edge 120 and off weigh platter 105 and can also determine the actual position of object 60 along lateral edge 120 of weigh platter 105.

Figure 6:
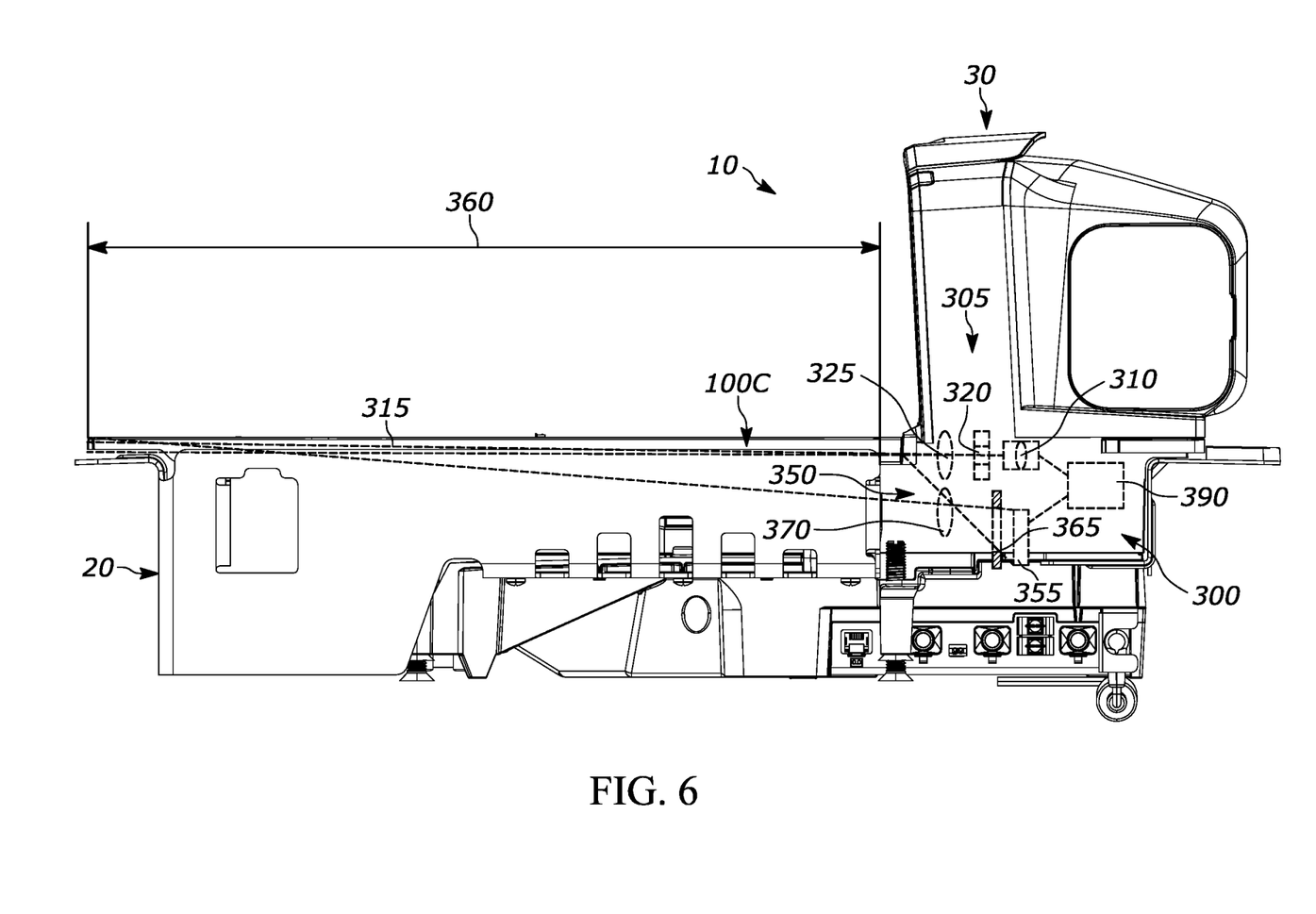
FIG. 6 illustrates a side view of the bioptic barcode reader of FIG. 1 with the weigh platter assembly having a third example parallax based off-platter detection assembly.

Referring to FIG. 6, barcode reader 10 is illustrated with another example weigh platter assembly 100C, which includes weigh platter 105 and parallax based off-platter detection assembly 300. The example off-platter detection assembly 300 generally includes a light emission assembly 305, light detection assembly 350, and controller 390 in communication with light emission assembly 305 and light detection assembly 350. For simplicity, only a single light emission assembly 305 and light detection assembly along lateral edge 120 are described herein, however, it will be understood that off-platter detection assembly 300 can also include a second light emission assembly and a second light detection assembly on an opposite side of weigh platter assembly 100C to detect objects that extend over an opposing lateral edge, opposite lateral edge 120.

Light emission assembly 305 has a light source 310 and is configured to emit a light beam 315 along lateral edge 120 of weigh platter 105. Light source 310 could be an LED that is focused into a narrow beam, similar to an aiming dot used in scanners, a focused laser beam, etc. and light beam 315 would preferably be on the infrared wavelength, but could also be visible light. Light emission assembly 305 can also include an aperture 320, which could be formed in a wall or protrusion of housing 15 or could be formed through another wall or structure that is part of weigh platter assembly 100C, positioned in front of light source 310 to focus light beam 315 into a narrow beam along lateral edge 120 of weigh platter 105. In addition, a lens 325 can be positioned in front of aperture 320 to increase the intensity of light beam 315.

Light detection assembly 350 is configured to detect at least a portion of light beam 315 that is reflected from an object that extends across light beam 315, and therefore off weigh platter 105, with sensor 355, which could be a photodetector, two-dimensional sensor array, proportional current-based position sensitive detector, linear imager array of pixels, etc. In the example shown, sensor 355 is vertically offset from light source 310 such that each has a different line of site along lateral edge 120 and to an object. Light source 310 is positioned above or aligned with weigh platter 105 and sensor 355 is positioned below weigh platter 105 and horizontally aligned with light source 310 to detect the portion of light beam 315 reflected from an object along lateral edge 120. An aperture 365, which could be formed in a wall or protrusion of housing 15 or could be formed through another wall or structure that is part of weigh platter assembly 100C, is positioned in front of sensor 355 and is configured with a specific shape and size to limit and control the FOV 360 of sensor 355 along lateral edge 120 to the length of lateral edge 120 between proximal edge 115 and distal edge 125. With the limited FOV 360 created by aperture 365, any portion of light beam 315 that is reflected from an object that is beyond distal edge 125 will not pass through aperture 365 and will not be detected by sensor 355. In addition, a lens 370 can be positioned in front of aperture 365 to increase the intensity of the portion of light reflected from an object extending across light beam 315 toward sensor 355.

To increase the accuracy of off-platter detection assembly 300, particularly in bright environments with multiple light sources, light emission assembly 305 can be configured to modulate light beam 315 at a predetermined frequency and sensor 355 can be configured to detect light at the predetermined frequency so that off-platter detection assembly 300 is insensitive to other light sources.

Controller 390 is in communication with light emission assembly 305 and sensor 355 of light detection assembly 350, and the second light emission assembly and light detection assembly if used, and is configured to determine if an object extends across lateral edge 120 and off of weigh platter 105. Controller 390 receives signals from sensor 355 of light detection assembly 350 and based on the signals received from sensor 355 of light detection assembly 350, controller 390 is configured to provide a first signal to a host system in response to a first value received from sensor 355 (e.g., a value indicating that no reflected light is being detected) and to provide a second signal, different from the first signal, in response to a second value received from sensor 355 (e.g., a value indicating that reflected light has been detected).

Figure 7:
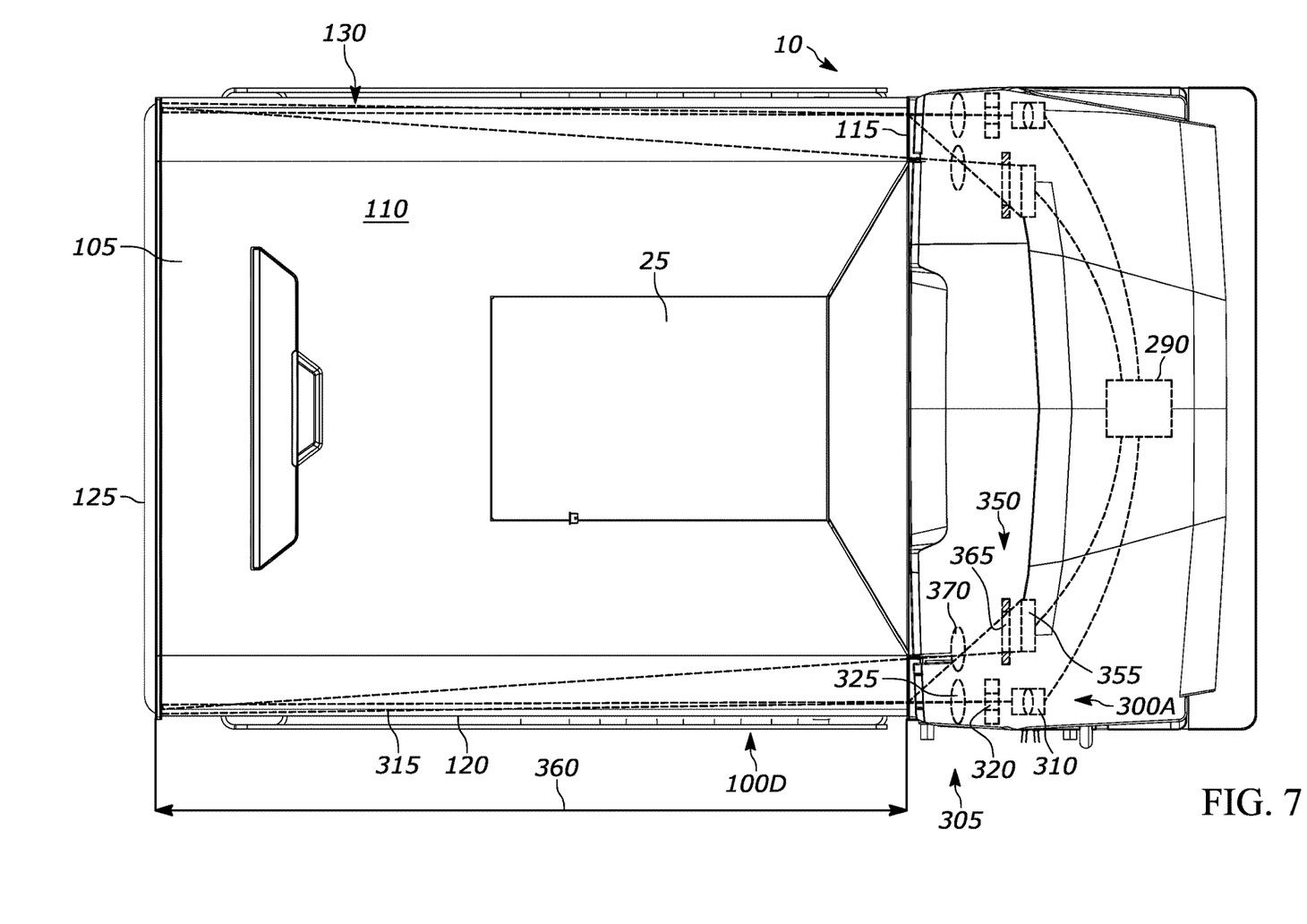
FIG. 7 illustrates a top view of the bioptic barcode reader of FIG. 1 with the weigh platter assembly having a fourth example parallax based off-platter detection assembly.

In FIG. 7, another barcode reader 10 is illustrated with another example weigh platter assembly 100D, which is essentially the same as weigh platter assembly 100C described above, except for the offset positioning of light source 310 and sensor 355. In the example shown in FIG. 7, sensor 355 is horizontally offset from light source 310 such that each has a different line of site along lateral edge 120 and to the object. Light source 310 is positioned above or aligned with weigh platter 105 and sensor 355 is positioned above weigh platter 105 and preferably vertically aligned with light source 310 to detect the portion of light beam 315 reflected from the object along lateral edge 120.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations. Moreover, no steps of any method disclosed herein shall be understood to have any specific order unless it is expressly stated that no other order is possible or required by the remaining steps of the respective method. Also, at least some of the figures may or may not be drawn to scale.

The benefits, advantages, solutions to problems, and any element(s) that may cause any benefit, advantage, or solution to occur or become more pronounced are not to be construed as a critical, required, or essential features or elements of any or all the claims. The legal scope of the property right is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The patent claims at the end of this patent application are not intended to be construed under 35 U.S.C. § 112(f) unless traditional means-plus-function language is expressly recited, such as "means for" or "step for" language being explicitly recited in the claim(s).

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A barcode reader comprising:
   a weigh platter configured to support an object placed on the weigh platter and having a proximal edge, a lateral edge extending non-parallel to the proximal edge, and a distal edge, opposite the proximal edge, extending non-parallel to the lateral edge; and
   an off-platter detection assembly comprising:
      a light emission assembly having a light source, the light emission assembly configured to emit a light along the lateral edge of the weigh platter;
      a light detection assembly configured to detect at least a portion of the light reflected from an object positioned between the proximal edge and the distal edge,
   the light detection assembly including a sensor offset from the light source and an aperture positioned in front of the sensor, the aperture configured to limit a field of view of the sensor along the lateral edge; and
      a controller in communication with the light detection assembly and configured to provide a first signal in response to a first value received from the sensor of the light detection assembly and to provide a second signal, different from the first signal, in response to a second value received from the sensor of the light detection assembly.

2. The barcode reader of claim 1, wherein:
   the barcode reader is a bioptic barcode reader configured to be supported by a workstation;

the bioptic barcode reader comprises a housing including a lower housing having a generally horizontal window and an upper housing extending generally perpendicular to the lower housing and having a generally vertical window, the lower housing including the weigh platter; and the proximal edge of the weigh platter is adjacent the upper housing.

3. The barcode reader of claim 1, wherein the light emission assembly includes an aperture positioned in front of the light source to focus the light beam into a narrow beam along the lateral edge of the weigh platter.

4. The barcode reader of claim 3, comprising a lens positioned in front of the aperture of the light emission assembly to increase an intensity of the light beam.

5. The barcode reader of claim 1, wherein the sensor is one of a photodetector, a two-dimensional sensor array, a proportional current-based position sensitive detector, or a linear imager array of pixels.

6. The barcode reader of claim 1, wherein the light detection assembly includes a lens positioned in front of the aperture of the light detection assembly to increase an intensity of the portion of the light beam reflected from the object.

7. The barcode reader of claim 1, wherein the light emission assembly is configured to modulate the light beam at a predetermined frequency and the sensor is configured to detect light at the predetermined frequency.

8. The barcode reader of claim 1, wherein each of the light source and the sensor is positioned above or aligned with the weigh platter.

9. The barcode reader of claim 1, wherein the field of view of the sensor overlaps the light between the distal edge of the weigh platter and the proximal edge of the weigh platter.

10. The barcode reader of claim 1, wherein the field of view of the sensor does not overlap the light beyond the distal edge of the weigh platter.

11. A method of off-platter detection, comprising:

emitting a light from a light source along a lateral edge of a weigh platter configured to support an object placed on the weigh platter;

detecting, via a sensor offset from the light source and having a field of view along the lateral edge of the weigh platter, at least a portion of the light reflected toward the sensor;

providing a first signal in response to a first value received from the sensor; and providing a second signal, different from the first signal, in response to a second value received from the sensor.

12. The method of claim 11, wherein the providing the first signal includes determining that the object extends across the lateral edge and off the weigh platter.

13. The method of claim 12, wherein the providing the second signal is associated with the object not extending across the lateral edge and off the weigh platter.

14. The method of claim 11, wherein:

the barcode reader is a bioptic barcode reader configured to be supported by a workstation;

the bioptic barcode reader comprises a housing including a lower housing having a generally horizontal window and an upper housing extending generally perpendicular to the lower housing and having a generally vertical window, the lower housing including the weigh platter; and the proximal edge of the weigh platter is adjacent the upper housing.

15. The method of claim 11, wherein the light source is part of a light emission assembly that includes an aperture positioned in front of the light source to focus the light beam into a narrow beam along the lateral edge of the weigh platter.

16. The method of claim 15, wherein the light emission assembly further includes a lens positioned in front of the aperture of the light emission assembly to increase an intensity of the light beam.

17. The method of claim 11, wherein the sensor is part of a light detection assembly that includes a lens positioned in front of an aperture of the light detection assembly to increase an intensity of the at least the portion of the light reflected toward the sensor.

18. The method of claim 11, wherein the field of view of the sensor overlaps the light between a distal edge of the weigh platter and the proximal edge of the platter.

19. The method of claim 11, wherein the field of view of the sensor does not overlap the light beyond the distal edge of the weigh platter.

20. The method of claim 11, wherein each of the light source and the sensor is positioned above or aligned with the weigh platter.

* * * * *